(12) United States Patent
Rinne et al.

(10) Patent No.: US 8,643,177 B2
(45) Date of Patent: Feb. 4, 2014

(54) WAFERS INCLUDING PATTERNED BACK SIDE LAYERS THEREON

(75) Inventors: Glenn A. Rinne, Apex, NC (US); Kevin Engel, Gilbert, AZ (US); Julia Roe, Hillsborough, NC (US); Christopher John Berry, Chandler, AZ (US)

(73) Assignee: Amkor Technology, Inc., Chandler, AZ (US)

(*) Notice: Subject to any disclaimer, the term of this patent is extended or adjusted under 35 U.S.C. 154(b) by 184 days.

(21) Appl. No.: 12/968,794

(22) Filed: Dec. 15, 2010

(65) Prior Publication Data

US 2011/0079901 A1     Apr. 7, 2011

Related U.S. Application Data

(62) Division of application No. 11/621,630, filed on Jan. 10, 2007, now Pat. No. 7,871,899.

(60) Provisional application No. 60/758,130, filed on Jan. 11, 2006.

(51) Int. Cl.
*H01L 23/498* (2006.01)

(52) U.S. Cl.
USPC ........... 257/734; 438/460; 438/462; 438/464; 438/465

(58) Field of Classification Search
USPC ............. 438/457, 113, 458, 460, 462, 68, 33, 438/464, 465; 257/618, 620, E23.179, 734
See application file for complete search history.

(56) References Cited

U.S. PATENT DOCUMENTS

| | | | |
|---|---|---|---|
| 4,560,580 | A | 12/1985 | Needham et al. |
| 4,687,693 | A | 8/1987 | Sheyon et al. |
| 4,945,204 | A | 7/1990 | Nakamura et al. |
| 5,083,191 | A | 1/1992 | Ueda |
| 5,158,818 | A | 10/1992 | Aurichio |
| 5,261,593 | A | 11/1993 | Casson et al. |
| 5,294,812 | A | 3/1994 | Hashimoto et al. |
| 5,311,059 | A | 5/1994 | Banerji et al. |

(Continued)

FOREIGN PATENT DOCUMENTS

| | | |
|---|---|---|
| JP | 63285955 | 11/1988 |
| JP | 01-309345 | 12/1989 |

(Continued)

OTHER PUBLICATIONS

"Experimental Product RP-695-2" Non-Conductive WBL Film for Die Encapsulation, Ablestik Jun. 2001.

(Continued)

*Primary Examiner* — Daniel Whalen
*Assistant Examiner* — Suberr Chi
(74) *Attorney, Agent, or Firm* — McAndrews, Held & Malloy

(57) ABSTRACT

A method of processing a wafer including a plurality of integrated circuit devices on a front side of the wafer, may include thinning the wafer from a back side opposite the front side. After thinning the wafer, a back side layer may be provided on the back side of the thinned wafer opposite the front side, and the back side layer may be configured to counter stress on the front side of the wafer including the plurality of integrated circuit devices thereon. After providing the back side layer, the plurality of integrated circuit devices may be separated. Related structures are also discussed.

20 Claims, 6 Drawing Sheets

(56) References Cited

U.S. PATENT DOCUMENTS

| | | | |
|---|---|---|---|
| 5,319,242 | A | 6/1994 | Carney et al. |
| 5,356,949 | A | 10/1994 | Komiyama et al. |
| 5,357,077 | A | 10/1994 | Tsuruta |
| 5,504,374 | A | 4/1996 | Oliver et al. |
| 5,536,970 | A | 7/1996 | Higashi et al. |
| 5,789,809 | A | 8/1998 | Joshi |
| 5,851,845 | A | 12/1998 | Wood et al. |
| 5,882,956 | A | 3/1999 | Umehara et al. |
| 5,892,288 | A | 4/1999 | Muraki et al. |
| 5,925,936 | A | 7/1999 | Yamaji |
| 5,936,304 | A | 8/1999 | Lii et al. |
| 5,986,235 | A | 11/1999 | Canella |
| 6,007,920 | A | 12/1999 | Umchara et al. |
| 6,023,094 | A | 2/2000 | Kao et al. |
| 6,034,437 | A | 3/2000 | Shibata |
| 6,075,290 | A | 6/2000 | Schaefer et al. |
| 6,175,162 | B1 | 1/2001 | Kao et al. |
| 6,184,064 | B1 | 2/2001 | Jiang et al. |
| 6,441,487 | B2 | 8/2002 | Elenius et al. |
| 6,734,532 | B2 | 5/2004 | Koduri et al. |
| RE38,789 | E | 9/2005 | Kao et al. |
| 7,135,385 | B1 * | 11/2006 | Patwardhan et al. .......... 438/464 |
| 7,510,908 | B1 | 3/2009 | Nguyen et al. |
| 2003/0022465 | A1 * | 1/2003 | Wachtler ................ 438/462 |
| 2004/0104491 | A1 | 6/2004 | Connell et al. |
| 2004/0121611 | A1 * | 6/2004 | Arita ......................... 438/710 |
| 2007/0093038 | A1 * | 4/2007 | Koenig ...................... 438/460 |

FOREIGN PATENT DOCUMENTS

| | | |
|---|---|---|
| JP | 02-039442 | 2/1990 |
| JP | 04-067643 | 3/1992 |
| JP | 04116955 | 4/1992 |
| JP | 04-277654 | 10/1992 |
| JP | 06184824 | 7/1994 |
| JP | 08-172159 | 7/1996 |
| JP | 09-180973 | 7/1997 |
| JP | 11-284090 | 10/1999 |

OTHER PUBLICATIONS

T.L. Hoopman et al; "New Film-Type Die Attach, Adhesives" 3M; IEEE pp. 473-479.

Doot "Motorola's First DCA Product: The Gold Line Pen Pager" Motorola, Inc., Electronic Components and Technology Conference 535-539 1996.

Feinstein "Die Attachment Methods" Sprague Electric Company, Electronic Materials Handbook, vol. 1 Packaging 213-223 1989.

Hu et al. "Die Cracking in Flip-Chip-on-Board Assembly" Motorola, Inc. 293-299 1995.

Kurata et al. "Dual Operational Amplifier using Flip-chip Fine Package of 1.0X1.0X0.6-mm with 8-pin counts" New Japan Radio Co., Ltd. Semiconductor Technology Headquarters, Electronic Components and Technology Conference 1-5 2001.

Lachance et al. "Corrosion/Migration Study of Flip Chip Underfill and Ceramic Overcoating" IBM Microelectronics Division, Electronic Components and Technology Conference 885-889 1997.

Lim "The Impact of Wafer Back Surface Finish on Chip Strength" Texas Instruments Singapore Pte Ltd 131-136 1989.

Popelar "An Investigation Into the Fracture of Silicon Die Used in Flip Chip Application" Delco Electronics Corporation, International Symposium on Advanced Packaging Materials 41-48 1998.

Ranjan et al. "Die Cracking in Flip Chip Assemblies" Department of Systems Science and Industrial Engineering, State University of New York, Electronic Components and Technology Conference 729-733 1998.

Umehara Application of Die Attachless Process fro Plastic Packages (Thermoplastic PolymideTransferred Wafer Techology), Texas Instruments Japan and Lintec Corporation, Electronic Components and Technology Conference 979-985 1997.

* cited by examiner under that an outside part after chip assembly. The plastic film of the '532 patent is selected from a group of electrically insulating materials including polyimide, epoxy resin, and silicone, and the film may further include hardener, tackyfier, and fillers.

WAFERS INCLUDING PATTERNED BACK SIDE LAYERS THEREON

RELATED APPLICATION

The present application claims the benefit of priority and is a divisional of U.S. application Ser. No. 11/621,630 filed Jan. 10, 2007, which claims the benefit of priority from U.S. Provisional application No. 60/758,130 filed Jan. 11, 2006. The disclosures of both of the above referenced applications are hereby incorporated herein in their entireties by reference.

FIELD OF THE INVENTION

The present invention relates to the field of electronics, and more particularly, to back side layers for microelectronic wafer processing.

BACKGROUND

U.S. Pat. No. 6,734,532 entitled "Back Side Coating Of Semiconductor Wafers" ("the '532 patent") discusses a semiconductor device including a semiconductor chip having an active and a passive surface (or side). The active surface includes an integrated circuit (I/C) and input/output (I/O) pads suitable for metallurgical contacts. Further, the device has a protective plastic film of controlled and uniform thickness selectively attached to the passive surface. The film is suitable to absorb light of visible and ultraviolet wavelengths, to remain insensitive to moisture absorption, and to exert thermomechanical stress on the chip such that this stress at least partially neutralizes the stress exerted by an outside part after chip assembly. The plastic film of the '532 patent is selected from a group of electrically insulating materials including polyimide, epoxy resin, and silicone, and the film may further include hardener, tackyfier, and fillers.

The plastic film thickness of the '532 patent preferably ranges from 20 to 60 :m (micrometers), the light absorption is at least 96%, and the neutralizing stress is provided by a film Coefficient of Thermal Expansion (CTE) of about 18 to 45 ppm/degree C, approximately matching the CTE of the outside part, such as a printed wiring board. After curing, the film has an adhesion strength of about 400 kg/cm² and a modulus of about 16 GPa.

The plastic film is rolled onto the passive surface of the whole semiconductor wafer and cured at elevated temperatures, preferably about 150 degree C., for a length of time of about 1 hour. After film hardening, the wafer sawing process is applied to the semiconductor and film material concurrently in order to singulate the individual chips. The disclosure of the '532 patent is hereby incorporated herein in its entirety by reference.

U.S. Pat. No. 6,023,094 entitled "Semiconductor Wafer Having A Bottom Surface Protective Layer" (the '094 patent) discusses a packaged integrated circuit device. The disclosure of the '094 patent is hereby incorporated herein in its entirety by reference.

SUMMARY

According to some embodiments of the present invention, a method of processing a wafer including a plurality of integrated circuit devices on a front side of the wafer may include thinning the wafer from a back side opposite the front side. After thinning the wafer, a back side layer may be provided on the back side of the thinned wafer, and the back side layer may be configured to counter stress on the front side of the wafer. After providing the back side layer, the plurality of integrated circuit devices may be separated.

A plurality of interconnection bumps, such as solder bumps, may be provided on the front side of the wafer. The plurality of interconnection bumps may be provided before thinning the wafer, and a protective layer may also be provided on the interconnection bumps before thinning the wafer. In alternative embodiments of the present invention, thinning the wafer may precede providing the plurality of interconnection bumps. Providing the back side layer may precede providing the plurality of interconnection bumps, or providing the plurality of interconnection bumps may precede providing the back side layer.

The back side layer may include an epoxy, such as a thermoset epoxy. Moreover, providing the back side layer may include providing a sheet of back side layer material, adhering the back side of the thinned wafer to the sheet of the back side layer material, and trimming excess portions of the sheet of back side layer material away from the wafer. Before separating the plurality of integrated circuit devices, the back side layer may be patterned so that portions of the back side of the wafer are exposed through the patterned back side layer.

According to some other embodiments of the present invention, a method of processing a wafer including a plurality of integrated circuit devices on a front side of the wafer may include providing a plurality of interconnection bumps on the front side of the wafer. The wafer may be thinned from a back side opposite the front side. After providing the plurality of interconnection bumps and after thinning the wafer, a back side layer may be provided on the back side of the thinned wafer opposite the front side. After providing the back side layer, the plurality of integrated circuit devices may be separated.

A plurality of interconnection bumps, such as solder bumps, may be provided on the front side of the wafer. Providing the plurality of interconnection bumps may precede thinning the wafer, and a protective layer may be provided on the interconnection bumps before thinning the wafer. Thinning the wafer may precede providing the plurality of interconnection bumps, or providing the back side layer may precede providing the plurality of interconnection bumps.

The back side layer may include an epoxy, such as a thermoset epoxy. Moreover, providing the back side layer may include providing a sheet of back side layer material, adhering the back side of the thinned wafer to the sheet of the back side layer material, and trimming excess portions of the sheet of back side layer material away from the wafer. Before separating the plurality of integrated circuit devices, the back side layer may be patterned so that portions of the back side of the wafer are exposed through the patterned back side layer.

According to still other embodiments of the present invention, an electronic structure may include a wafer including having front and back sides, and a plurality of integrated circuit devices on the front side of the wafer. A back side layer on the back side of the wafer opposite the front side may be patterned so that portions of the back side of the wafer are exposed through the back side layer.

The back side layer may be configured to counter stresses on the front side of the wafer. Moreover, the back side layer may be configured to provide asymmetric counter stresses aligned with respect to asymmetric stresses on the front side of the wafer.

The back side layer may be patterned to expose streets between individual integrated circuit devices where the wafer will be cut to separate the integrated circuit devices. The back side layer may be patterned to provide directionality and/or a modulation of stresses. Moreover, the back side layer may comprise an epoxy, such as a thermoset epoxy, and a plurality of interconnection bumps may be provided on the front side of the wafer.

According to yet other embodiments of the present invention, a method of processing a wafer including a plurality of integrated circuit devices on a front side of the wafer may include thinning the wafer from a back side opposite the front side. After thinning the wafer, a back side layer may be provided on the back side of the thinned wafer, and the plurality of integrated circuit devices may be separated.

A plurality of interconnection bumps may be formed on the front side of the wafer. The plurality of interconnection bumps may include a plurality of solder bumps. Moreover, forming the plurality of interconnection bumps may precede thinning the wafer, and a protective layer may be formed on the interconnection bumps before thinning the wafer. In alternative embodiments of the present invention, thinning the wafer may precede forming the plurality of interconnection bumps. Providing the back side layer may precede forming the plurality of interconnection bumps, or forming the plurality of interconnection bumps may precede providing the back side layer.

The back side layer may include an epoxy such as a thermoset epoxy. Providing the back side layer may include providing a sheet of back side layer material, adhering the back side of the thinned wafer to the sheet of the back side material, and trimming excess portions of the sheet of back side layer material away from the wafer. Moreover, the back side layer may be patterned before separating the plurality of integrated circuit devices so that portions of the back side layer are exposed through the patterned back side layer.

BRIEF DESCRIPTION OF THE DRAWINGS

FIGS. 1A-6A and 1B-6B are cross sectional views illustrating steps of thinning wafers according to first embodiments of the present invention.

FIGS. 7A-11A and 7B-11B are cross sectional views illustrating steps of thinning wafers according to second embodiments of the present invention.

DETAILED DESCRIPTION

Figure 1A:
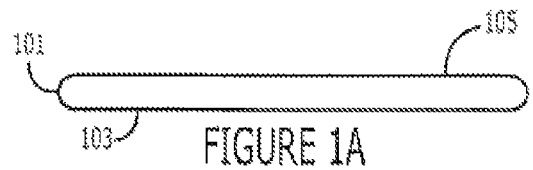

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. Similarly, when an element such as a layer, region or substrate is referred to as being coupled or connected to/with another element, it can be directly coupled or connected to/with the other element or intervening elements may also be present. In contrast, if an element such as a layer, region or substrate is referred to as being directly coupled or connected to/with another element, then no other intervening elements are present. As used herein, the term "and/or" includes any and all combinations of one or more of the associated listed items. The symbol "/" is also used as a shorthand notation for "and/or".

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a patterned feature (such as a perimeter of a hole) illustrated having sharp transitions may typically have a rounded or curved transition. Thus, the regions illustrated in the figures are schematic in nature and their shapes are not intended to illustrate the actual shape of a region of a device and are not intended to limit the scope of the invention.

Furthermore, relative terms, such as beneath, upper, lower, top, bottom, and the like may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes", and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

An integrated circuit wafer may tend to bend, bow, and/or warp due to differences in stresses on opposite surfaces (i.e., the front or active side and the back or passive side) of the wafer. Bending, bowing, and/or warping may increase if the integrated circuit wafer is thinned because thinning may reduce an intrinsic strength of the integrated circuit wafer.

According to embodiments of the present invention, a film or films can be applied to a back (passive) side of a thinned integrated circuit wafer to balance stresses on the opposite sides of the thinned wafer and to thereby reduce and/or eliminate bending, bowing, and/or warping.

A difficulty of automated and/or manual handling of integrated circuit wafers (such as wafers used to fabricate integrated circuit devices for wafer-scale or flip-chip packaging) can be increased as a result of wafer bowing, bending, and/or warping that may result when dissimilar stresses are applied to the opposing major surfaces (sides) of the wafer. A vacuum chuck may use a vacuum to hold a back side of the wafer against a planar surface of the vacuum chuck, for example, and bowing, bending, and/or warping of the wafer may result in an insufficient vacuum to hold the wafer to the chuck. Moreover, bowing, bending, and/or warping of the wafer may reduce precision during photolithography because different portions of the front side of the wafer may be different distances from an optical system and/or mask of a mask alignment/exposure system. Wafer handling may be particularly difficult during processing steps after wafer thinning, such as wafer test, bump formation, and/or dicing (also referred to as singulation or sawing).

According to some embodiments of the present invention, a back side layer can be applied to the back (passive) side of a thinned wafer to reduce bending, bowing, and/or warping. Moreover, a stress applied by the back side layer can be tailored to a particular wafer application, for example, by adjusting properties of the back side layer such as back side layer thickness, back side layer material, back side layer filler (type, particle size and shape, distribution), deposition method/temperature, cure temperature profile, and/or annealing treatment(s).

According to some embodiments of the present invention, a silica-filled B-stage epoxy that is cast in sheets with a thickness in the range of about 25 :m (micrometers) to about 75 :m (micrometers), and more particularly in the range of about 40 :m (micrometers) to about 50 :m (micrometers), may be used as a back side layer to reduce bending, bowing, and/or warping. Thicker back side layers may even reverse a bow from concave (front side up) to convex. The back side layer may be applied in B-stage and cured to C-stage. In the C-stage, the back side layer may provide relatively stable stress properties, and the modulus may be sufficiently high to counter stress on the front (active) side of the wafer.

Examples of other back side layers are discussed for example in the '532 and the '094 patents, the disclosures of which are hereby incorporated herein in their entirety by reference. In an alternative or in addition, a back side layer may include a layer of polyimide, a layer of an oxide (such as silicon oxide), and/or a layer of a nitride (such as silicon nitride). A polyimide back side layer may be applied, for example, by coating such as spin coating and/or curtain coating. An oxide and/or nitride back side layer may be applied, for example, by sputtering and/or chemical vapor deposition.

According to some embodiments of the present invention, the back side layer may be a thermoset epoxy with carbon black impregnated therein and having a thickness in the range of about 40 :m (micrometers) to 50 :m (micrometers). More particularly, the thermoset epoxy may be provided as a sheet, and the thinned wafer back side may be bonded to a portion of the thermoset epoxy sheet by increasing a temperature of the thermoset epoxy sheet and applying roller pressure while the wafer is in contact with the heated thermoset epoxy sheet. Excess portions of the thermoset epoxy sheet extending beyond the wafer back side may then be trimmed from around the wafer using a die cutter that cuts the thermoset epoxy sheet from around the wafer to provide a thermoset epoxy back side layer. The thermoset epoxy back side layer may then be cured by baking in an oven.

According to some embodiments of the present invention, the back side layer may be a filled compound thermoset epoxy (such as a silica filled epoxy) formed by a molding technique such as compression molding. For example, a cavity mold may be pressed against the wafer back side, and the cavity of the mold may be filled with the back side material, and a back side layer so formed may have a thickness, for example, in the range of about 100 :m (micrometers) to about 300 :m (micrometers). The thickness and/or the Coefficient of Thermal Expansion (CTE) of the compression molded back side material may be engineered to provide an appropriate stress. As discussed above, thicker layers may provide greater stress, and thinner layers may provide less stress. Moreover, the CTE of a silica filled epoxy may be reduced by increasing a silica content and increased by reducing a silica content. According to some other embodiments of the present invention, the back side layer may be formed by injection molding a thermoplastic such as a liquid crystal polymer (LCP).

Moreover, a stress applied by a back side layer may be linearly dependent on a thickness of the back side layer so that thicker back side layers apply greater stress. The back side layer may also be patterned to provide a modulation of stresses on a local scale and/or directionality on a global scale. For example, the back side layer may be removed from dicing kerfs to reduce localized stresses that may otherwise have a tendency to chipout during dicing. For example, the back side layer may be patterned to expose streets between individual integrated circuit devices (die) of the wafer where the wafer will be cut to separate the integrated circuit devices. Moreover, if the integrated circuit wafer has asymmetric stresses on the front side, then the wafer may tend to bow along a specific diameter. By patterning the back side layer, counter stresses may be aligned with respect to stresses on the front, side of the wafer.

In addition, a back side layer may reduce a fragility of a thinned integrated circuit wafer so that the wafer may be thinned before applying bumps (such as solder bumps) to the wafer. Accordingly, a relatively planar front surface may be provided during grinding (and/or other) operations used to thin the wafer. A uniformity of wafer thickness may thus be improved after thinning, and/or a tape and/or film used to protect interconnection bumps may be omitted during the grinding operations. Use of back side layers after wafer thinning may thus provide cost reduction and/or improvement in wafer thickness uniformity.

FIGS. 1A-6A are cross sectional views of steps of processing an integrated circuit wafer according to some embodiments of the present invention. FIGS. 1B-6B are enlarged cross sectional views of a single integrated circuit device of the wafer at the steps illustrated in FIGS. 1A-6A.

Figure 1B:
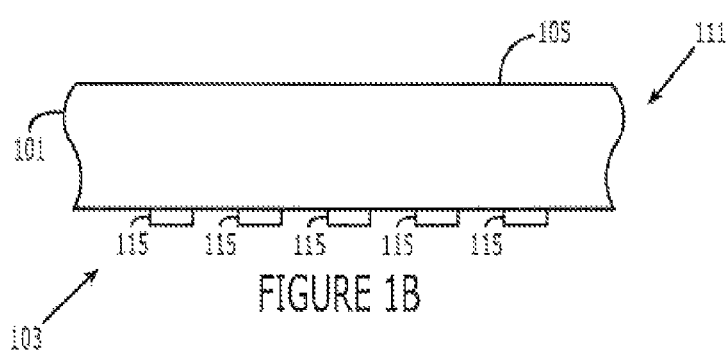

As shown in FIGS. 1A-B, an integrated circuit wafer 101 (such as a silicon substrate with patterned layers of conductive and insulating materials thereon) may include a plurality of integrated circuit devices fabricated on a front (active) side 103 thereof. An example of one integrated circuit device 111 of the wafer 101 is illustrated in FIG. 1B. Each integrated circuit device 111 may include a plurality of electronic devices (such as resistors, capacitors, transistors, diodes, inductors, etc.) and/or electrical interconnections in and/or on a front (active) side 103 thereof, and a back (passive) side 105 may be free of electronic devices and/or interconnections. Moreover, a plurality of conductive input/output pads 115 may provide electrical interconnection with the electronic devices and/or interconnections of the integrated circuit device 111. In addition, the integrated circuit wafer 101 may be interpreted to include the input/output pads 115.

Figure 2A:
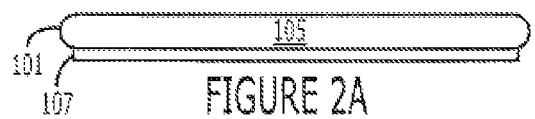
Figure 2B:
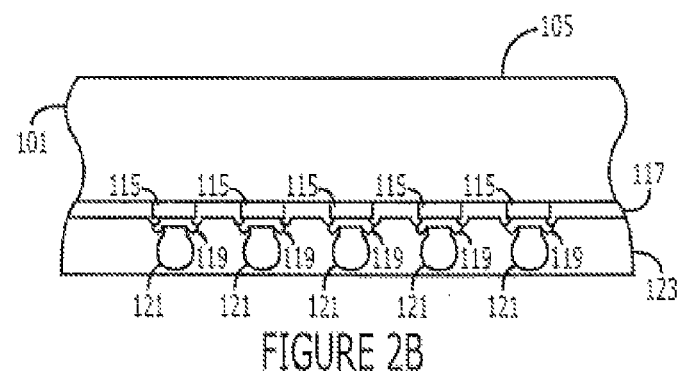

As shown in FIGS. 2A-B, a passivation layer 117, underbump metallurgy layers 119, and electrical and mechanical interconnection bumps 121 (such as solder bumps) may be formed on the front side 103 of the integrated circuit wafer 101, for example, to provide subsequent flip-chip interconnection to a next level of packaging (such as a printed circuit board). A protective layer 123 may protect the bumps 121 during a subsequent step of thinning the integrated circuit wafer 101. The passivation layer 117, underbump metallurgy layers 119, electrical and mechanical interconnection bumps 121, and protective layer 123 illustrated separately in FIG. 2B are illustrated collectively as layer 107 in FIG. 2A.

More particularly, the passivation layer 117 may be a polyimide layer formed on the front side 103 of the wafer and then patterned to expose portions of the input/output pads 115. A continuous under bump metallurgy layer may then be formed on the passivation layer 117 and on exposed portions of the input/output pads 115 to provide an electrode for electroplating solder. A plating mask can then be formed exposing portions of the continuous under bump metallurgy layer, and solder can be plated on the exposed portions of the continuous under bump metallurgy layer to form bumps 121. After forming the bumps 121, the plating mask and portions of the continuous under bump metallurgy layer between the bumps 121 can be removed to form the separate under bump metallurgy layers 119. A protective layer 123 (such as a layer of photoresist and/or a tape) can be provided on the front side 103 of the wafer 101 including the bumps 121. According to other embodiments of the present invention, each of the bumps 121 may be formed by placing a preformed solder ball/mass on a respective under bump metallurgy layer 119 and then subjecting the solder ball/mass to reflow.

While not shown in FIGS. 2A-B, a plurality of passivation layers and/or redistribution lines may also be provided. For example, a first passivation layer may expose portions of the input/output pads, and conductive redistribution lines may be provided on the first passivation layer and on exposed portions of the input/output pads. A second passivation layer may be provided on the conductive redistribution lines and on the first passivation layer, and holes in the second passivation layer may expose portions of the redistribution lines laterally separated from the respective input/output pads. Under bump metallurgy layers and bumps may then be provided on the exposed portions of the redistribution lines. An interconnection bump may thus be laterally separated from an input/output pad with electrical connection between the laterally separated input/output pad and interconnection bump being provided through a respective redistribution line. If multiple passivation layers and/or redistribution lines are provided, these additional elements may be considered a portion(s) of the collective layer 107 of FIG. 2A. Moreover, portions of conductive redistribution lines between respective bumps and input/output pads may be exposed on the passivation layer 117 (i.e., between the passivation layer 117 and the protective layer 123), and/or an epoxy layer may be provided on the passivation layer 117 (and/or on exposed portions of any redistribution lines) between the passivation layer 117 and the protective layer 123.

One or more of the passivation layer(s) 117, redistribution lines, underbump metallurgy layers 119, electrical and mechanical interconnection bumps 121, and/or protective layer 123 may exert a stress on the wafer 101 that tends to bow the wafer so that the front side 103 is concave. For example, the passivation layer 117 may be coated on the front side 103 of the wafer 101 as a liquid, and cured, and the curing of the passivation layer 117 may result in stress on the front side of the wafer.

Figure 3A:
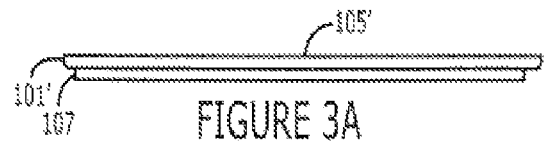
Figure 3B:
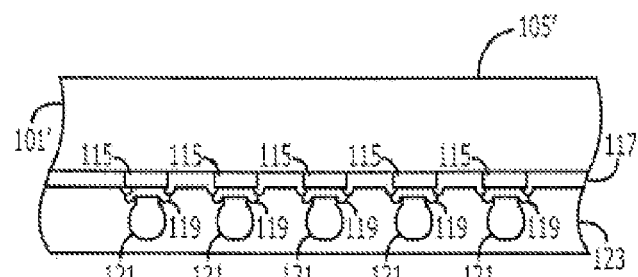

As shown in FIGS. 3A-B, the wafer 101 may be thinned by grinding the back side 105 to provide the thinned wafer 101' with the thinned back side 105'. More particularly, the wafer 101 may, for example, have a thickness of about 25 mils before thinning, and the thinned wafer 101' may, for example, have a thickness in the range of about 10 mils to about 12 mils. In other words, about 13 mils to about 15 mils of the back side of the wafer may be ground away. The protective layer 123 may protect the front side 103 of the wafer 101 including the bumps 121 while grinding the back side. The protective layer 123 may also provide a more planar surface during grinding so that a uniformity of thickness of the thinned wafer 101' can be improved. While grinding is discussed by way of example, the wafer may be thinned using other techniques such as chemical etch back (without mechanical grinding), chemical mechanical polishing, plasma thinning, and/or surface conditioning.

Figure 4A:
Figure 4B:
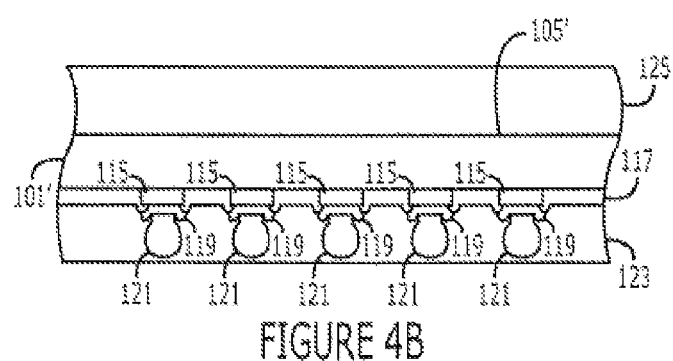

After thinning, a strength of the thinned wafer 101' may be reduced, and wafer bowing may occur. In some cases, wafer bowing of up to, for example, 2 mm (millimeter) may occur such that a central portion of the front side 103 of the thinned wafer 101' may be recessed 2 mm relative to edges portions of the front side 103 of the thinned wafer 101'. As shown in FIGS. 4A-B, a back side layer 125 may be applied to the thinned back side 105' to counteract stresses on the front side of the thinned wafer and to counteract bowing, bending, and/or warping that may result from stresses on the front side of the wafer. According to some embodiments of the present invention, stresses applied by the back side layer 125 may be about the same as stresses applied on the front side of the thinned wafer 101' so that bowing, bending, and/or warping may be substantially reduced and/or eliminated. Moreover, stresses applied by the back side layer 125 may be sufficient to reverse bowing, bending, and/or warping so the front side of the thinned wafer 101' is convex.

As discussed above, the back side layer 125 may be a silica-filled B-stage epoxy that is cast in sheets with a thickness in the range of about 25 :m (micrometers) to about 75 :m (micrometers), and more particularly in the range of about 40 :m (micrometers) to about 50 :m (micrometers). The back side layer 125 may be applied in B-stage and cured to C-stage. In the C-stage, the back side layer 125 may provide relatively stable stress properties, and the modulus may be sufficiently high to counter stress on the front side (active side) of the thinned wafer 101'.

Additional examples of materials for the back side layer 125 are discussed in the '532 and the '094 patents, the disclosures of which are hereby incorporated herein in their entirety by reference. In an alternative or in addition, a back side layer 125 may include a layer of polyimide, a layer of an oxide (such as silicon oxide), and/or a layer of a nitride (such as silicon nitride). A polyimide back side layer may be applied, for example, by coating such as spin coating and/or curtain coating. An oxide and/or nitride back side layer may be applied, for example, by sputtering and/or chemical vapor deposition.

According to some embodiments of the present invention, the back side layer 125 may be a thermoset epoxy with carbon black impregnated therein and having a thickness in the range of about 40 :m (micrometers) to about 50 :m (micrometers). More particularly, the thermoset epoxy may be provided as a sheet, and the thinned wafer back side 105' may be bonded to a portion of the thermoset epoxy sheet by increasing a temperature of the thermoset epoxy sheet and applying roller pressure while the thinned wafer back side 105' is in contact with the heated thermoset epoxy sheet. Excess portions of the thermoset epoxy sheet extending beyond the thinned back side 105' may then be trimmed from around the wafer using a die cutter that cuts the thermoset epoxy sheet from around the wafer 101' to provide a thermoset epoxy as the back side layer 125. The thermoset epoxy back side layer 125 may then be cured by baking in an oven.

Moreover, a stress applied by the back side layer 125 may be linearly dependent on a thickness of the back side layer. The back side layer 125 may also be patterned to provide a modulation of stresses on a local scale and/or directionality on a global scale. For example, the back side layer 125 may be removed from dicing kerfs to reduce localized stresses that may otherwise increase a tendency to chipout during dicing. For example, the back side layer 125 may be patterned 122 to expose streets 122' between individual die integrated circuit devices (die) of the wafer where the wafer will be cut to separate the integrated circuit devices. Moreover, if the thinned wafer 101' has asymmetric stresses on the fronts side 103, then the thinned wafer 101' may tend to bow along a specific diameter. By patterning the back side layer 125, counter stresses may be aligned with respect to stresses on the front of the thinned wafer 101'.

According to some embodiments of the present invention, the back side layer may be a filled compound thermoset epoxy (such as a silica filled epoxy) formed by a molding technique such as compression molding. For example, a cavity mold may be pressed against the wafer back side, and the cavity of the mold may be filled with the back side material, and a back side layer so formed may have a thickness, for example, in the range of about 100 :m (micrometers) to about 300 :m (micrometers). The thickness and/or the Coefficient of Thermal Expansion (CTE) of the compression molded back side material may be engineered to provide an appropriate stress. As discussed above, thicker layers may provide greater stress, and thinner layers may provide less stress. Moreover, the CTE of a silica filled epoxy may be reduced by increasing a silica content and increased by reducing a silica content. According to some other embodiments of the present invention, the back side layer may be formed by injection molding a thermoplastic such as a liquid crystal polymer (LCP).

Figure 5A:
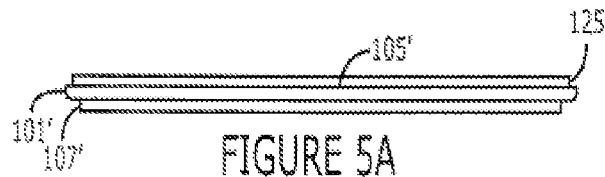
Figure 5B:
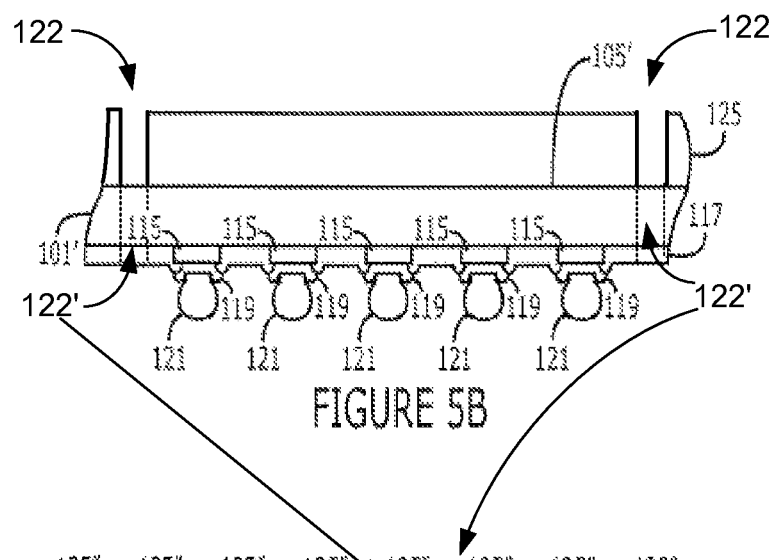

The protective layer 123 may then be removed from the thinned wafer 101' to expose the bumps 121 for wafer level testing as shown in FIGS. 5A-B. The integrated circuit devices on the thinned wafer 101' can then be tested and marked before dicing. Accordingly, the layer 107' of FIG. 5A may include the passivation layer 117, the under bump metallurgy layers 119, and the interconnection bumps 121 without the protective layer 123 which has been removed. The layer 107' of FIG. 5A may also include multiple passivation layers and/or redistribution lines as discussed above.

Figure 6A:
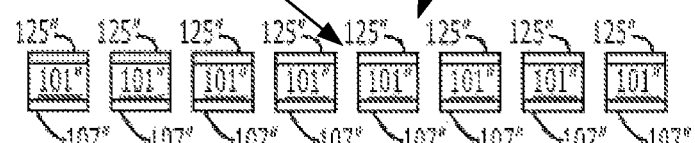
Figure 6B:
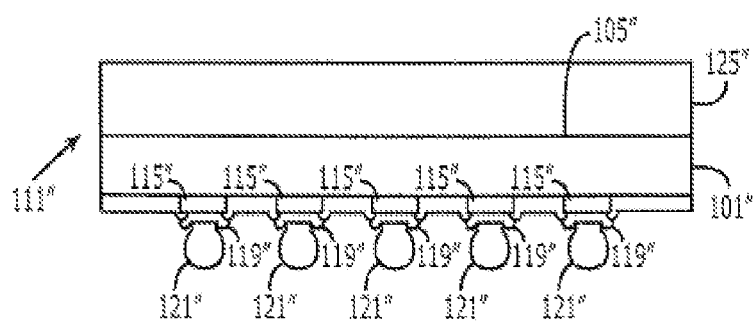

After testing and marking, the thinned wafer 101' may be diced (or sawed) to provide separate integrated circuit devices 111" as illustrated in FIGS. 6A-B. As shown, the back side layer may be diced with the wafer so that the diced back side layers 125" substantially cover an entirety of the back side of each of the separate integrated circuit devices 111". Moreover, the layers 107" in FIG. 6A may include the passivation layers 117", input/output pads 119", and/or interconnection bumps 121" of each integrated circuit device 111". The layers 107" of FIG. 6A may also include multiple passivation layers and/or redistribution lines as discussed above.

FIGS. 7A-11A are cross sectional views of steps of processing an integrated circuit wafer according to some additional embodiments of the present invention. FIGS. 7B-11B are enlarged cross sectional views of a single integrated circuit device of the wafer at the steps illustrated in FIGS. 7A-11A.

Figure 7A:
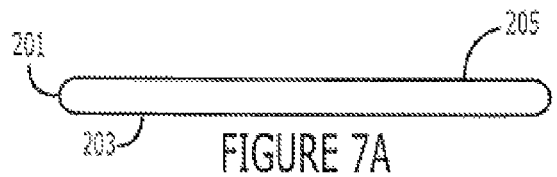
Figure 7B:
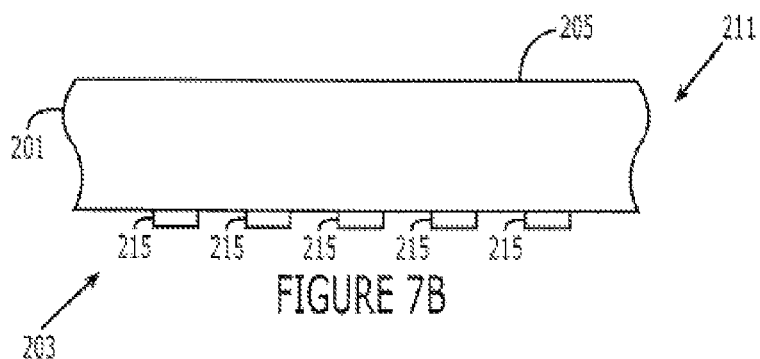

As shown in FIGS. 7A, an integrated circuit wafer 201 (such as a silicon substrate with patterned layers of conductive and insulating materials thereon) may include a plurality of integrated circuit devices fabricated on a front (active) side 203 thereof. An example of one integrated circuit device 211 of the wafer 201 is illustrated in FIG. 7B. Each integrated circuit device 211 may include a plurality of electronic devices (such as resistors, capacitors, transistors, diodes, inductors, etc.) and/or electrical interconnections in and/or on a front (active) side 203 thereof, and a back (passive) side 205 may be free of electronic devices and/or interconnections. Moreover, a plurality of conductive input/output pads 215 may provide electrical interconnection with the electronic devices and/or interconnections of the integrated circuit device 211. In addition, the integrated circuit wafer 201 may be interpreted to include the input/output pads 215.

Figure 8A:
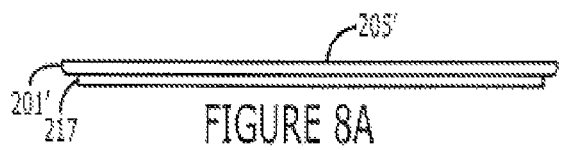
Figure 8B:
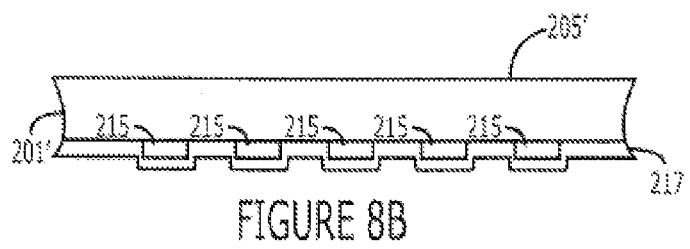

As shown in FIGS. 8A-B, a passivation layer 217 may be provided on the front side 203 of the wafer 201 including the input/output pads 215. While not shown in FIGS. 8A-B, a plurality of passivation layers and/or redistribution lines may also be provided. For example, a first passivation layer may expose portions of the input/output pads, and conductive redistribution lines may be provided on the first passivation layer and on exposed portions of the input/output pads. A second passivation layer may be provided on the conductive redistribution lines and on the first passivation layer. Subsequently formed interconnection bumps may thus be laterally separated from input/output pads to which they are electrically connected through respective redistribution lines. For example, the passivation layer(s) 217 may be coated on the front side of the wafer as a liquid, and cured, and the curing of the passivation layer(s) may result in stress on the front side of the wafer. More particularly, the passivation layer 217 may be a polyimide layer formed on the front side 203 of the wafer. The passivation layer can be patterned (before or after thinning the wafer) to expose portions of the input/output pads 215.

After forming the passivation layer(s) and/or redistribution lines, the wafer 201 may be thinned by grinding the back side 205 to provide the thinned wafer 201' with the thinned back side 205'. More particularly, the wafer 201 may have a thickness of, for example, about 25 mils before thinning, and the thinned wafer 201' may have a thickness in the range of, for example, about 10 mils to about 12 mils. In other words, about 13 mils to about 15 mils of the back side of the wafer may be ground away. The passivation layer(s) 217 may protect the input/output pads 215 while grinding the back side. While grinding is discussed by way of example, the wafer may be thinned using other techniques such as chemical etch back (without mechanical grinding), chemical mechanical polishing, plasma thinning, and/or surface conditioning.

According to other embodiments of the present invention, the wafer 205 may be thinned before forming the passivation layer(s) 217 and/or redistribution lines. In either case, a separate protective layer (such as protective layer 123 discussed above with respect to FIGS. 1-6) may be omitted because the wafer is thinned before forming interconnection bumps. Accordingly, a processing step and/or a processing material may be omitted thereby reducing cost.

Figure 9A:
Figure 9B:
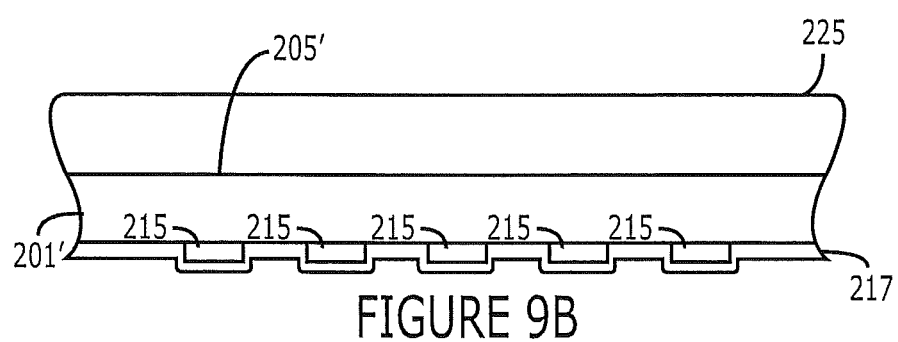

After thinning, a strength of the thinned wafer 201' may be reduced, and wafer bowing may occur. In some cases, wafer bowing of, for example, up to 2 mm (millimeter) may occur such that a central portion of the front side 203 of the thinned wafer 201' may be recessed 2 mm relative to edges portions of the front side 203 of the thinned wafer 201'. As shown in FIGS. 9A-B, a back side layer 225 may be applied to the thinned back side 205' to counteract stresses on the front side of the thinned wafer and to counteract bowing, bending, and/or warping that may result from stresses on the front side of the wafer. According to some embodiments of the present invention, stresses applied by the back side layer may be about the same as stresses applied on the front side of the thinned wafer 201' so that bowing, bending, and/or warping may be substantially reduced and/or eliminated. Moreover, stresses applied by the back side layer 225 may be sufficient to reverse bowing, bending, and/or warping so the front side of the thinned wafer 201' is convex, if so desired.

As discussed above, the back side layer 225 may be a silica-filled B-stage epoxy that is cast in sheets with a thickness in the range of about 25 μm (micrometers) to about 75 μm (micrometers), and more particularly in the range of about 40 μm (micrometers) to about 50 μm (micrometers). The back side layer 225 may be applied in B-stage and cured to C-stage. In the C-stage, the back side layer 225 may provide relatively stable stress properties, and the modulus may be sufficiently high to counter stress on the front side (active side) of the thinned wafer 201'.

Additional examples of materials for the back side layer 225 are discussed in the '532 and the '094 patents, the disclosures of which are hereby incorporated herein in their entirety by reference. In an alternative or in addition, a back side layer 225 may include a layer of polyimide, a layer of an oxide (such as silicon oxide), and/or a layer of a nitride (such as silicon nitride). A polyimide back side layer may be applied, for example, by coating such as spin coating and/or curtain coating. An oxide and/or nitride back side layer may be applied, for example, by sputtering and/or chemical vapor deposition.

According to some embodiments of the present invention, the back side layer 225 may be a thermoset epoxy with carbon black impregnated therein and having a thickness in the range of about 40 μm (micrometers) to 50 μm (micrometers). More particularly, the thermoset epoxy may be provided as a sheet, and the thinned wafer back side 205' may be bonded to a portion of the thermoset epoxy sheet by increasing a temperature of the thermoset epoxy sheet and applying roller pressure while the thinned wafer back side 205' is in contact with the heated thermoset epoxy sheet. Excess portions of the thermoset epoxy sheet extending beyond the thinned back side 205' may then be trimmed from around the wafer using a die cutter that cuts the thermoset epoxy sheet from around the wafer 201' to provide a thermoset epoxy as the back side layer 225. The thermoset epoxy back side layer 225 may then be cured by baking in an oven.

Moreover, a stress applied by the back side layer 225 may be linearly dependent on a thickness of the back side layer. The back side layer 225 may also be patterned to provide a modulation of stresses on a local scale and/or directionality on a global scale. For example, the back side layer 225 may be removed from dicing kerfs to reduce localized stresses that may otherwise increase a tendency to chipout during dicing. For example, the back side layer may be patterned to expose streets between individual integrated circuit devices (die) of the wafer where the wafer will be cut to separate the integrated circuit devices. Moreover, if the thinned wafer 201' has asymmetric stresses on the front side 203, then the thinned wafer 201' may tend to bow along a specific diameter. By patterning the back side layer 225, counter stresses may be aligned with respect to stresses on the front side of the thinned wafer 201'.

According to some embodiments of the present invention, the back side layer may be a filled compound thermoset epoxy (such as a silica filled epoxy) formed by a molding technique such as compression molding. For example, a cavity mold may be pressed against the wafer back side, and the cavity of the mold may be filled with the back side material, and a back side layer so formed may have a thickness, for example, in the range of about 100 μm (micrometers) to about 300 μm (micrometers). The thickness and/or the Coefficient of Thermal Expansion (CTE) of the compression molded back side material may be engineered to provide an appropriate stress. As discussed above, thicker layers may provide greater stress, and thinner layers may provide less stress. Moreover, the CTE of a silica filled epoxy may be reduced by increasing a silica content and increased by reducing a silica content. According to some other embodiments of the present invention, the back side layer may be formed by injection molding a thermoplastic such as a liquid crystal polymer (LCP).

If passivation layer(s) and/or redistribution lines are not formed before thinning the wafer, some or all of passivation layer(s) and/or redistribution lines and/or additional passivation layers and/or redistribution lines may be formed before or after applying the back slide layer 225.

Figure 10A:
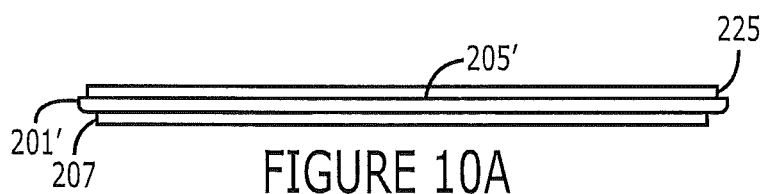
Figure 10B:
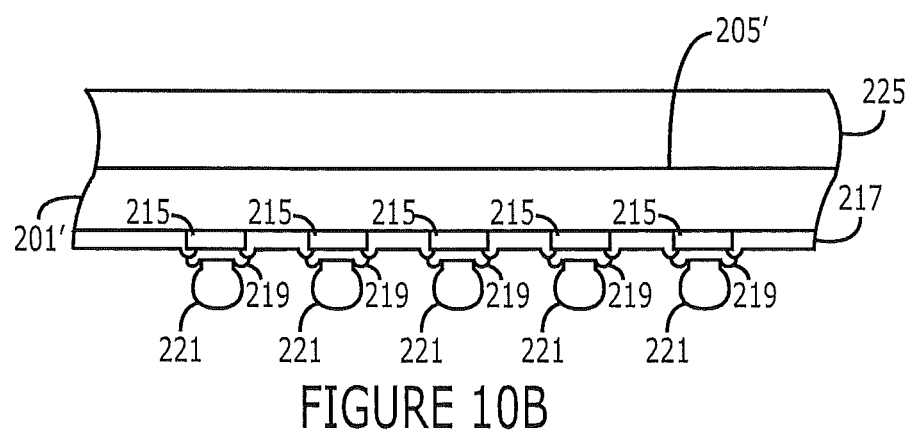

As shown in FIGS. 10A-B, a passivation layer 217, under-bump metallurgy layers 219, and electrical and mechanical interconnection bumps 221 (such as solder bumps) may be formed on the front side 203 of the thinned integrated circuit wafer 201', for example, to provide subsequent flip-chip interconnection to a next level of packaging (such as a printed circuit board). A separate protective layer (such as protective layer 123 discussed above with respect to FIGS. 1-6) may be omitted because the interconnection bumps 221 are formed after thinning the wafer. The passivation layer 217, under-bump metallurgy layers 219, and electrical and mechanical interconnection bumps 221 illustrated separately in FIG. 10B are illustrated collectively as layer 207 in FIG. 10A.

More particularly, the passivation layer 217 may be a polyimide layer formed (before or after wafer thinning and/or back side layer application) on the front side 203 of the wafer and then patterned (before or after wafer thinning and/or back side layer application) to expose portions of the input/output pads 215. A continuous under bump metallurgy layer may then be formed (before or after wafer thinning and/or back side layer application) on the passivation layer 217 and on exposed portions of the input/output pads 215 to provide an electrode for electroplating solder. A plating mask can then be formed exposing portions of the continuous under bump metallurgy layer after wafer thinning and after applying the back side layer 225, and solder can be plated on the exposed portions of the continuous under bump metallurgy layer to form bumps 221. After forming the bumps 221, the plating mask and portions of the continuous under bump metallurgy layer between the bumps 221 can be removed to form the separate under bump metallurgy layers 219. A separate protective layer (such as protective layer 123 discussed above with respect to FIGS. 1-6) can be omitted because the interconnection bumps are formed after wafer thinning. According to other embodiments of the present invention, each of the bumps 221 may be formed by placing a preformed solder ball/mass on a respective under bump metallurgy layer 219 and then subjecting the solder ball/mass to reflow.

While not shown in FIGS. 10A-B, a plurality of passivation layers and/or redistribution lines may also be provided. For example, a first passivation layer may expose portions of the input/output pads, and conductive redistribution lines may be provided on the first passivation layer and on exposed portions of the input/output pads. A second passivation layer may be provided on the conductive redistribution lines and on the first passivation layer, and holes in the second passivation layer may expose portions of the redistribution lines laterally separated from the respective input/output pads. Under bump metallurgy layers and bumps may then be provided on the exposed portions of the redistribution lines. An interconnection bump may thus be laterally separated from an input/output pad with electrical connection between the laterally separated input/output pad and interconnection bump being provided through a respective redistribution line. If multiple passivation layers and/or redistribution lines are provided, these additional elements may be considered a portion(s) of the collective layer 207 of FIG. 10A. Moreover, portions of conductive redistribution lines between respective bumps and input/output pads may be exposed on the passivation layer 217, and/or an epoxy layer may be provided on the passivation layer 217 (and/or on exposed portions of any redistribution lines).

The thinned wafer 201' with exposed interconnection bumps as shown in FIGS. 10A-10B may then be subjected to wafer level testing. The integrated circuit devices on the thinned wafer 201' can thus be tested and marked before dicing.

Figure 11A:
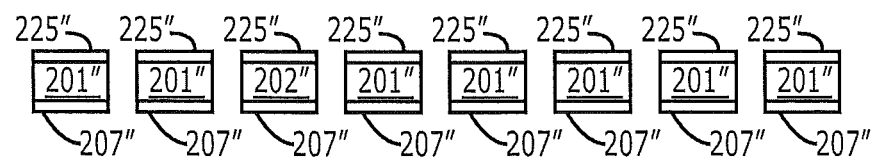
Figure 11B:
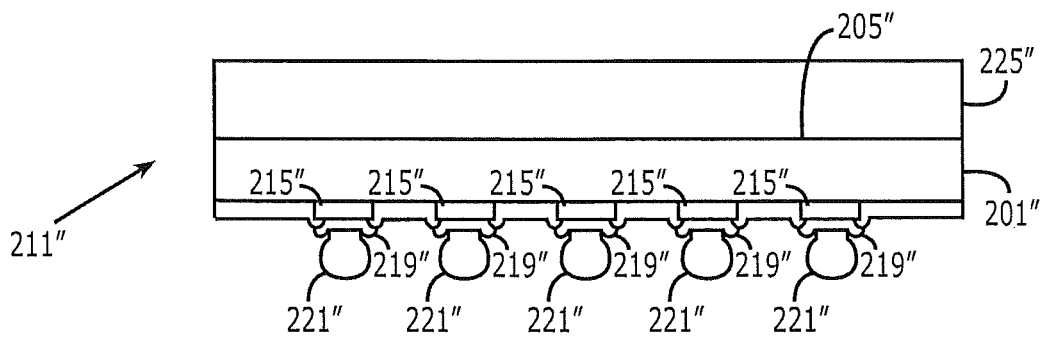

After testing and marking, the thinned wafer 201' may be diced (or sawed) to provide separate integrated circuit devices 211' as illustrated in FIGS. 11A-B. As shown, the back side layer may be diced with the wafer so that the diced back side layers 225" substantially cover an entirety of the back side of each of the separate integrated circuit devices 211". Moreover, the layers 207" in FIG. 11A may include the passivation layers 217", input/output pads 219", and/or interconnection bumps 221" of each integrated circuit device 211". The layers 207" of FIG. 11A may also include multiple passivation layers and/or redistribution lines as discussed above.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. An electronic structure comprising:
   a continuous wafer including opposing front and back sides wherein the back side of the wafer is continuous; a plurality of integrated circuit devices on the front side of the continuous wafer; and a back side layer on the continuous back side of the continuous wafer opposite the front side wherein the back side layer has a pattern therein so that portions of the continuous back side of the continuous wafer are exposed through the pattern in the back side layer, wherein the pattern in the back side layer is configured to counter stresses on the front side of the continuous wafer.

2. An electronic structure according to claim 1 wherein the pattern in the back side layer is configured to provide asymmetric counter stresses on the continuous back side of the continuous wafer aligned with respect to asymmetric stresses on the front side of the continuous wafer.

3. An electronic structure according to claim 1 wherein the pattern in the back side layer exposes streets between individual integrated circuit devices wherein the streets define portions of the continuous wafer separating the integrated circuit devices.

4. An electronic structure according to claim 1 wherein the back side layer comprises an epoxy.

5. An electronic structure according to claim 1 further comprising:
   a plurality of interconnection bumps on the front side of the continuous wafer.

6. An electronic structure according to claim 5 wherein the plurality of interconnection bumps comprise interconnection solder bumps.

7. An electronic structure according to claim 5 further comprising:
   a protective layer on the plurality of interconnection solder bumps so that the interconnection solder bumps are between the protective layer and the continuous wafer.

8. An electronic structure according to claim 1 wherein the back side layer comprises a thermoset epoxy.

9. An electronic structure according to claim 1 wherein the continuous wafer and the back side layer comprise different materials.

10. An electronic structure according to claim 1 wherein the continuous wafer comprises a continuous semiconductor wafer and wherein the back side layer comprises a non-semiconductor material.

11. An electronic structure according to claim 1 wherein the back side layer comprises a silica filled epoxy.

12. An electronic structure according to claim 11 wherein the back side layer has a thickness in the range of about 100 micrometers to about 300 micrometers.

13. An electronic structure according to claim 1 wherein the back side layer comprises a thermoplastic.

14. An electronic structure according to claim 1 wherein the back side layer comprises a thermoset epoxy with carbon black impregnated therein.

15. An electronic structure according to claim 14 wherein the back side layer has a thickness in the range of about 40 micrometers to about 50 micrometers.

16. An electronic structure according to claim 1 wherein the continuous wafer has a thickness in the range of about 10 mils to about 12 mils.

17. An electronic structure according to claim 1 wherein the back side layer comprises an epoxy layer having a thickness in the range of about 25 micrometers to about 75 micrometers.

18. An electronic structure comprising:
   a continuous wafer including opposing front and back sides wherein the back side of the wafer is continuous; a plurality of integrated circuit devices on the front side of the continuous wafer; and a back side layer on the continuous back side of the continuous wafer opposite the front side wherein the back side layer has a pattern therein so that portions of the continuous back side of the continuous wafer are exposed through the pattern in the back side layer, wherein the pattern in the back side layer exposes streets between individual integrated circuit devices, and wherein the streets define portions of the continuous wafer separating the integrated circuit devices.

19. An electronic structure comprising:
   a continuous wafer including opposing front and back sides wherein the back side of the wafer is continuous; a plurality of integrated circuit devices on the front side of the continuous wafer; and a back side layer on the continuous back side of the continuous wafer opposite the front side wherein the back side layer has a pattern therein so that portions of the continuous back side of the continuous wafer are exposed through the pattern in the back side layer, and wherein the pattern in the back side layer is configured to provide directionality of stresses on the continuous back side of the continuous wafer.

20. An electronic structure comprising:
a continuous wafer including opposing front and back sides wherein the back side of the wafer is continuous;
a plurality of integrated circuit devices on the front side of the continuous wafer; and
a back side layer on the continuous back side of the continuous wafer opposite the front side wherein the back side layer has a pattern therein so that portions of the continuous back side of the continuous wafer are exposed through the pattern in the back side layer, and wherein the pattern in the back side layer is configured to provide a modulation of stresses on the continuous back side of the continuous wafer.

* * * * *